(12) United States Patent
Oku (10) Patent No.: US 8,890,621 B2
(45) Date of Patent: Nov. 18, 2014

(54) AMPLIFIER CIRCUIT AND LIGHT RECEIVING CIRCUIT

(75) Inventor: Hideki Oku, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/603,591

(22) Filed: Sep. 5, 2012

(65) Prior Publication Data

US 2013/0120059 A1    May 16, 2013

(30) Foreign Application Priority Data

Nov. 16, 2011    (JP) .................................. 2011-251100

(51) Int. Cl.
*H03F 3/08*    (2006.01)

(52) U.S. Cl.
USPC ........................................................ 330/308

(58) Field of Classification Search
USPC .................. 330/59, 308; 250/214 A, 214 AG
See application file for complete search history.

(56) References Cited

U.S. PATENT DOCUMENTS

| 7,126,412 B2 * | 10/2006 | Amamiya ...................... 330/308 |
| 2003/0052739 A1 * | 3/2003 | Analui et al. ................. 330/311 |
| 2012/0070121 A1 * | 3/2012 | Ito et al. .......................... 385/88 |

OTHER PUBLICATIONS

Lu et al., "Broad-Band Design Techniques for Transimpedance Amplifiers", IEEE Transactions on Circuits and Systems-I: Regular Papers, vol. 54, No. 3, Mar. 2007, pp. 590-600.

* cited by examiner

*Primary Examiner* — Khanh V Nguyen
(74) *Attorney, Agent, or Firm* — Staas & Halsey LLP (57) ABSTRACT

An amplifier circuit includes: an input pad to receive a current signal; a conversion section to convert the current signal into a voltage signal; an inductor electrically connected in series between the input pad and the conversion section; and a storage element, one end of the storage element electrically coupled between the inductor and the conversion section, the other end of the storage element electrically coupled to a ground.

15 Claims, 9 Drawing Sheets

FIG. 9

AMPLIFIER CIRCUIT AND LIGHT RECEIVING CIRCUIT

CROSS-REFERENCE TO RELATED APPLICATION(S)

This application is based upon and claims the benefit of priority of the prior Japanese Patent Application No. 2011-251100, filed on Nov. 16, 2011, the entire contents of which are incorporated herein by reference.

FIELD

The embodiments discussed herein are related to an amplifier circuit and a light receiving circuit.

BACKGROUND

A photodiode (PD) receives an optical signal and converts the optical signal into an electrical signal. A transimpedance amplifier (TIA), which converts a current signal output from the PD into a voltage signal, is coupled to the PD.

The related art is disclosed in, for example, Zhenghao Lu, Kiat Seng Yeo, Jianguo Ma, Manh Anh Do, Wei Meng Lim, and Xueying Chen, "Broad-Band Design Techniques for Transimpedance Amplifiers", IEEE TRANSACTIONS ON CIRCUITS AND SYSTEMS, vol. 54, No. 3, pp. 590-600, 2007.

However, in the related art described above, it is difficult to shorten a bonding wire between the PD and the TIA. Thus, the distance between the PD and the TIA is made long and the size of the circuit is made large.

SUMMARY

According to one aspect of the embodiments, an amplifier circuit includes: an input pad to receive a current signal; a conversion section to convert the current signal into a voltage signal; an inductor electrically connected in series between the input pad and the conversion section; and a storage element, one end of the storage element electrically coupled between the inductor and the conversion section, the other end of the storage element electrically coupled to a ground.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In a circuit subsequent to a PD, a band and a noise characteristic of a signal may deteriorate due to an electrostatic capacitance of the PD. In order to expand the band and reduce the noise, a resonant circuit is formed in a TIA subsequent to the PD. In an inductor in the resonant circuit, a bonding wire between the PD and the TIA is used, for example.

Figure 1:
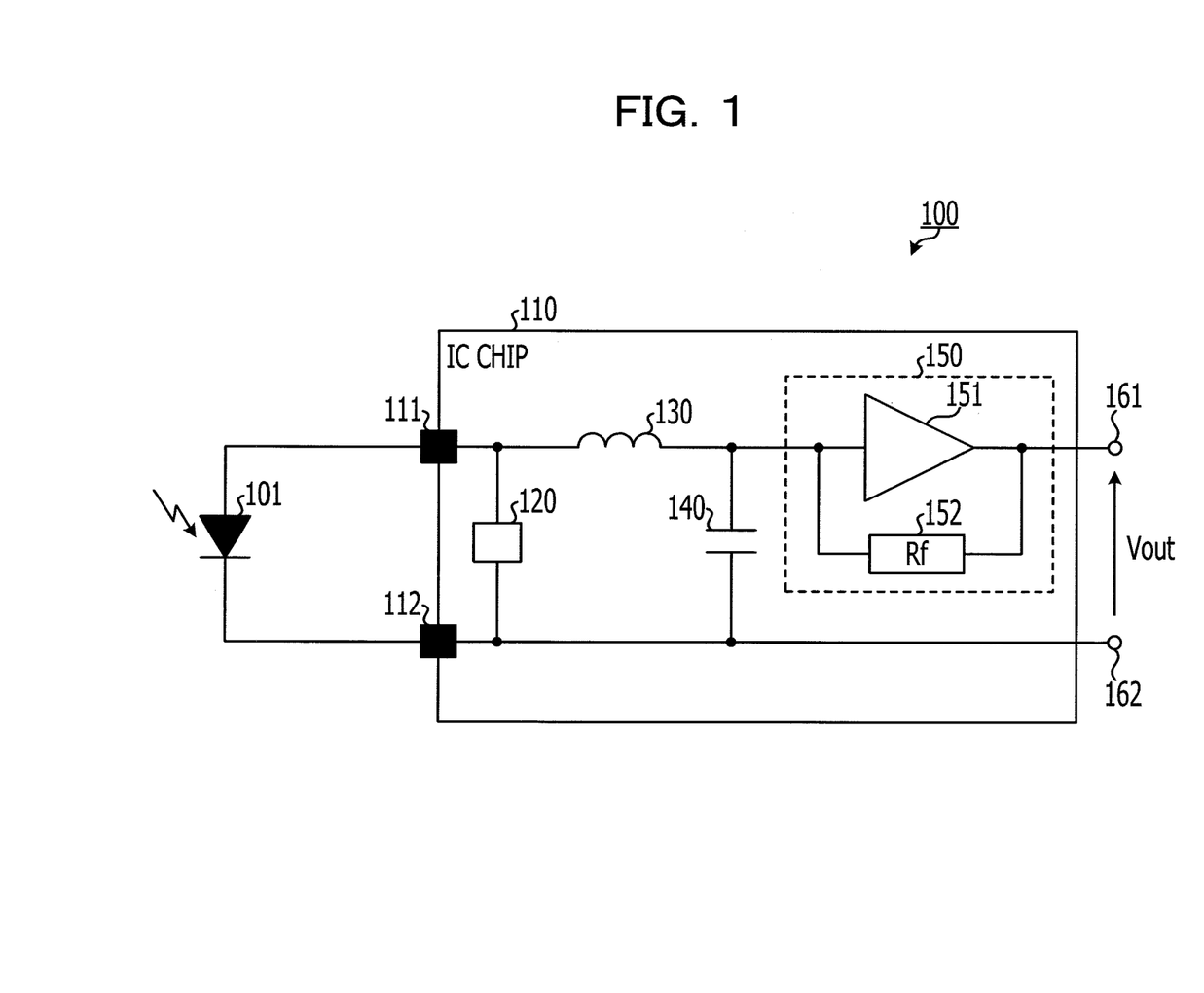
FIG. 1 illustrates an exemplary amplifier circuit.

FIG. 1 illustrates an exemplary amplifier circuit. A photodiode 101 illustrated in FIG. 1 outputs a current signal corresponding to received light. An amplifier circuit 100 may be, for example, a TIA chip that includes a TIA which converts a current signal output from the photodiode 101 into a voltage signal.

The amplifier circuit 100 includes pads 111 and 112, an ESD element 120, an on-chip inductor 130, a shunt capacitance 140, a TIA 150, an output terminal 161, and a ground terminal 162. The pads 111 and 112, the ESD element 120, the on-chip inductor 130, the shunt capacitance 140, and the TIA 150 may be provided on a single IC chip 110.

The pad 111 may correspond to an input pad into which a current signal is input. For example, the pad 111 is electrically coupled to the anode of the photodiode 101, and a current signal output from the photodiode 101 is input into the pad 111. The pad 111 may be an electrode pad having an electrostatic capacitance. The pad 111 is electrically coupled to the on-chip inductor 130. The pad 112 may be an electrode pad to which the cathode of the photodiode 101 is electrically coupled. The pad 112 is electrically coupled to the ground terminal 162.

The ESD element 120 may correspond to a protection element that protects the TIA 150 and a circuit subsequent to the TIA 150 from static electricity. An one end of the ESD element 120 is provided between the pad 111 and the on-chip inductor 130, and the other end of the ESD element 120 is electrically coupled to the ground terminal 162. The ESD element 120 flows static electricity applied to the pad 111, via the ground terminal 162 to a ground.

The on-chip inductor 130 may correspond to a spiral inductor that is electrically coupled in series between the pad 111 and the TIA 150. For example, one end of the on-chip inductor 130 is electrically coupled to the pad 111, and the other end of the on-chip inductor 130 is electrically coupled to the TIA 150. The on-chip inductor 130 may be formed by, for example, a wiring pattern on a substrate of the IC chip 110. The shunt capacitance 140 (shunt capacitor) may be a storage element of which one end is electrically coupled between the on-chip inductor 130 and the TIA 150 and of which the other end is electrically coupled to the ground terminal 162.

The TIA 150 may correspond to a conversion section that converts a current signal from the on-chip inductor 130 into a voltage signal and outputs the voltage signal. For example, the TIA 150 includes an amplifier 151 and a feedback resister 152 (Rf). The input side of the amplifier 151 is electrically coupled to the on-chip inductor 130, and the output side of the amplifier 151 is electrically coupled to the output terminal 161. The feedback resister 152 may be provided in parallel with the amplifier 151. For example, one end of the feedback resister 152 is electrically coupled to the input side of the amplifier 151, and the other end of the feedback resister 152 is electrically coupled to the output side of the amplifier 151.

The output terminal 161 outputs the voltage converted by the TIA 150 (Vout). A current signal output from the photodiode 101 is converted into a voltage signal, and the voltage signal is output. The ground terminal 162 is coupled (grounded) to the ground. In FIG. 1, a resonant circuit is formed by capacitances by the pad 111 and the ESD element 120, the on-chip inductor 130, and the shunt capacitance 140.

Figure 2:
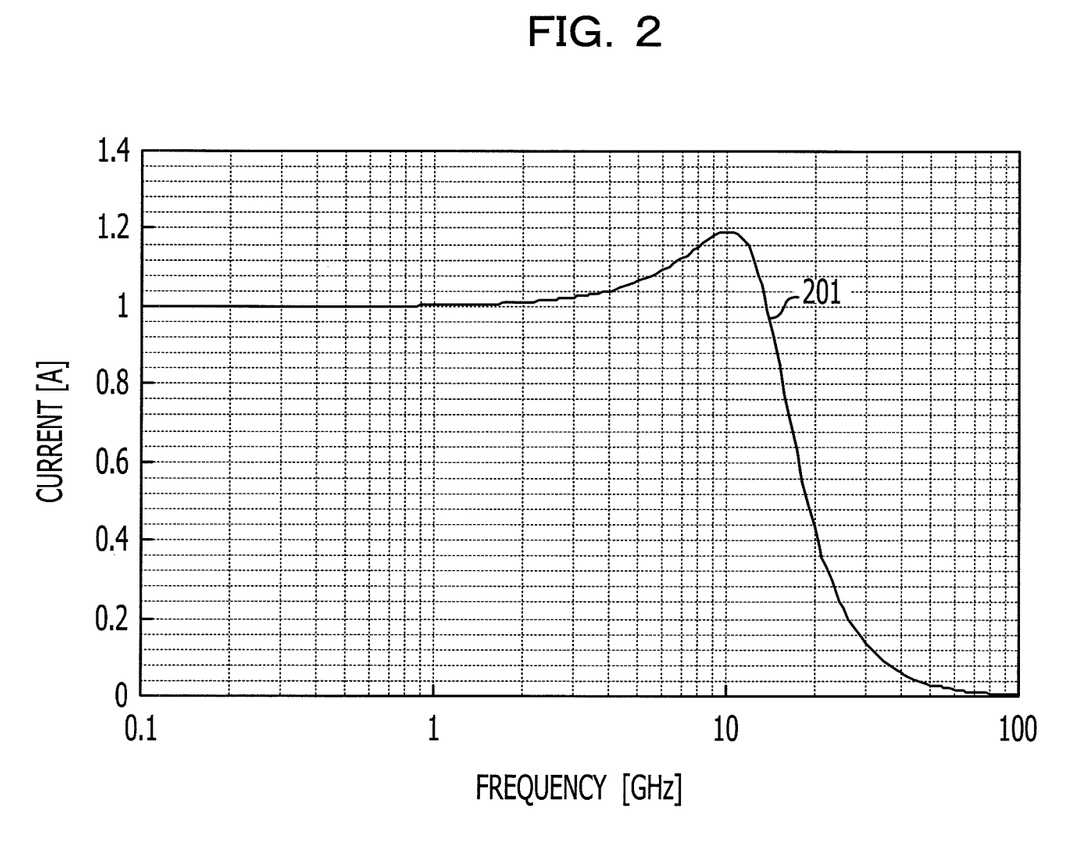
FIG. 2 illustrates an exemplary characteristic of current with respect to frequency.

FIG. 2 illustrates an exemplary current characteristic with respect to a frequency. FIG. 2 may illustrate an exemplary characteristic with respect to a frequency in the resonant circuit. The horizontal axis indicates the frequency [GHz] of a signal, and the vertical axis indicates the current [A] of the signal. A characteristic 201 indicates a current characteristic with respect to a frequency in the resonant circuit that is formed by the capacitances of the pad 111 and the ESD element 120, the on-chip inductor 130, and the shunt capacitance 140. As illustrated in the characteristic 201, a characteristic of the current in the vicinity of a high frequency, for example, of 10 [GHz] may improve due to the resonant circuit.

Figure 3:
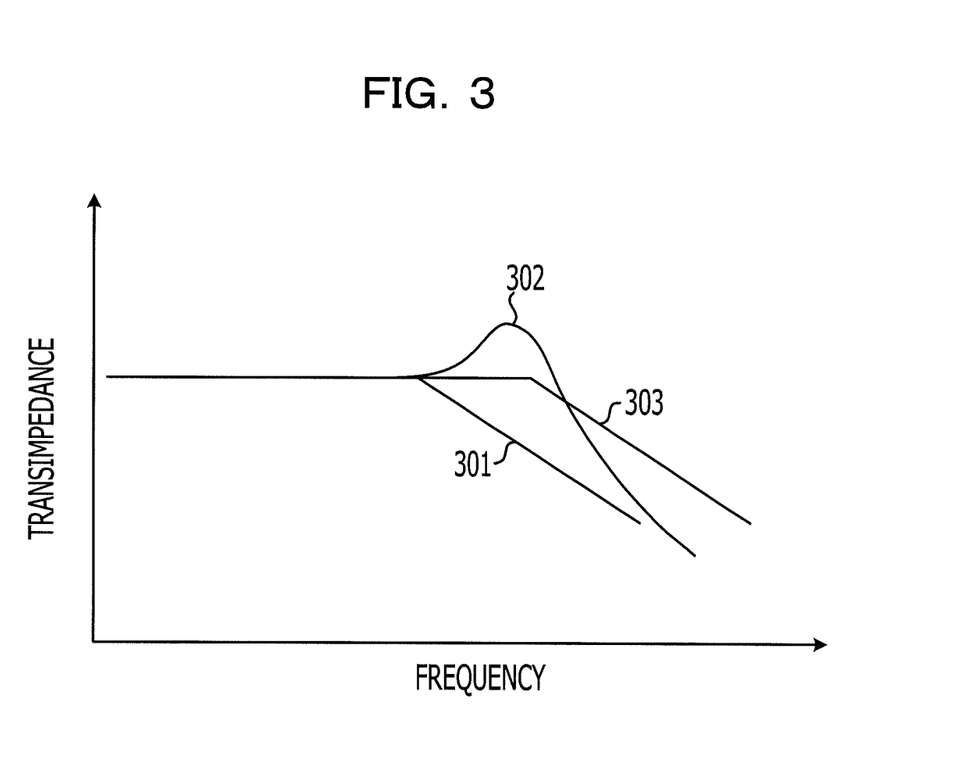
FIG. 3 illustrates an exemplary band expansion by a resonant circuit.

FIG. 3 illustrates an exemplary band expansion by a resonant circuit. The horizontal axis indicates the frequency of a signal, and the vertical axis indicates a transimpedance (efficiency of conversion from a current into a voltage). A characteristic 301 indicates a transimpedance characteristic with respect to the frequency of the signal in the TIA 150. As illustrated in the characteristic 301, the transimpedance in high frequencies may decrease in the TIA 150.

A characteristic 302 indicates a characteristic of the transimpedance with respect to the frequency of the signal in the resonant circuit that is formed by the capacitances of the pad 111 and the ESD element 120, the on-chip inductor 130, and the shunt capacitance 140. As illustrated in the characteristic 302, the transimpedance in high frequencies may increase in the resonant circuit (see FIG. 2).

A characteristic 303 indicates a characteristic of the transimpedance with respect to the frequency of the signal in the entire amplifier circuit 100. The characteristic 303 may be a characteristic obtained by combining the characteristic 301 and the characteristic 302. In the characteristic 303, the decrease of the transimpedance in the high frequencies is compensated for and a transimpedance is provided which is stable in a wide frequency band.

In the amplifier circuit 100, the resonant circuit is formed on a TIA chip by the capacitances of the pad 111 and the ESD element 120, the on-chip inductor 130, and the shunt capacitance 140. The influence of the electrostatic capacitance of the photodiode 101 may be reduced and the signal characteristic may improve.

For example, the size of the circuit may be reduced as compared to the case where a resonant circuit is formed by using a bonding wire and the like. Since the on-chip inductor 130 is used, variation of the signal characteristic may be reduced and the signal characteristic may improve as compared to the case where a bonding wire and the like are used. Due to a light receiving circuit that includes the photodiode 101 and the amplifier circuit 100, the size of the circuit may be reduced and the signal characteristic and the performance of receiving an optical signal may improve.

Figure 4:
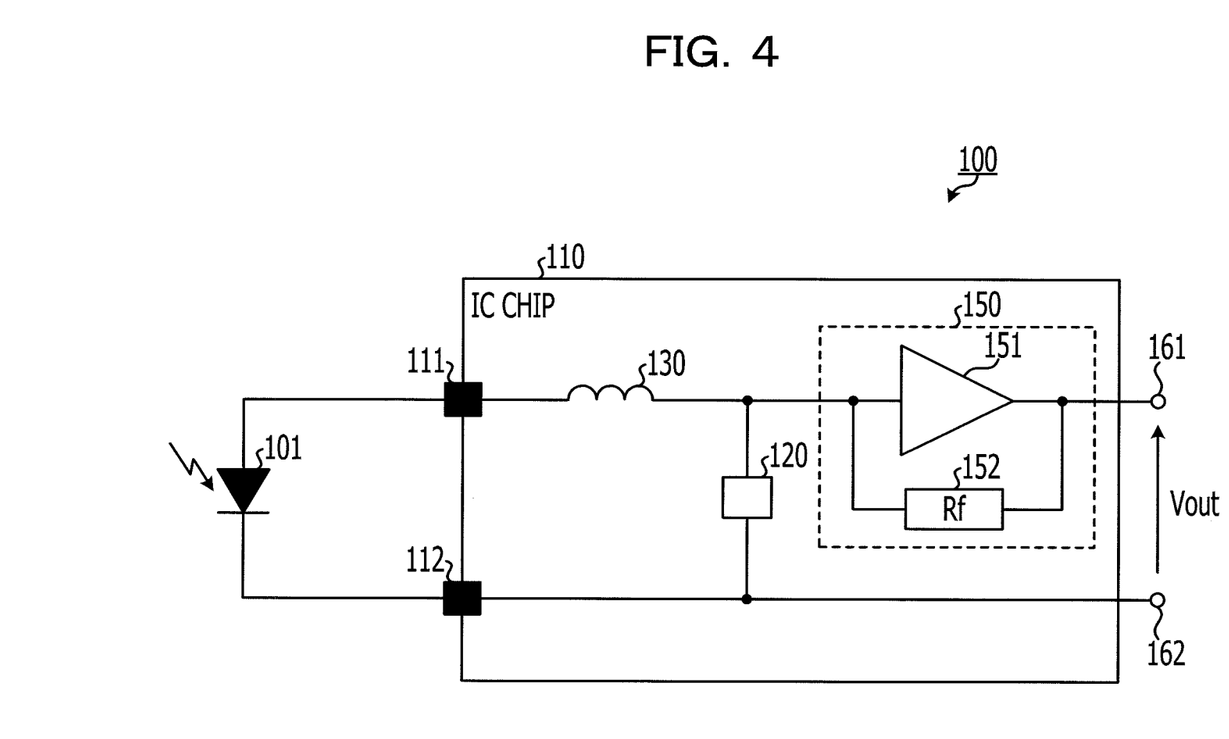
FIG. 4 illustrates an exemplary amplifier circuit.

FIG. 4 illustrates an exemplary amplifier circuit. In FIG. 4, elements that are substantially the same as or similar to the elements illustrated in FIG. 1 are designated by the same reference signs, and the description thereof may be omitted or reduced. As illustrated in FIG. 4, the ESD element 120 is electrically connected between the on-chip inductor 130 and the TIA 150 in the amplifier circuit 100.

In FIG. 4, the shunt capacitance 140 illustrated in FIG. 1 may be omitted. The element that flows, to the ground, the static electricity applied to the pad 111 between the pad 111 and the on-chip inductor 130, may be omitted. In the amplifier circuit 100 illustrated in FIG. 4, a resonant circuit is formed by the capacitance of the pad 111, the on-chip inductor 130, and the ESD element 120.

The ESD element 120 is used not only as a protection circuit for protection from static electricity but also as a storage element in the resonant circuit. Thus, the shunt capacitance 140 is omitted and the size of the circuit is reduced.

Figure 5:
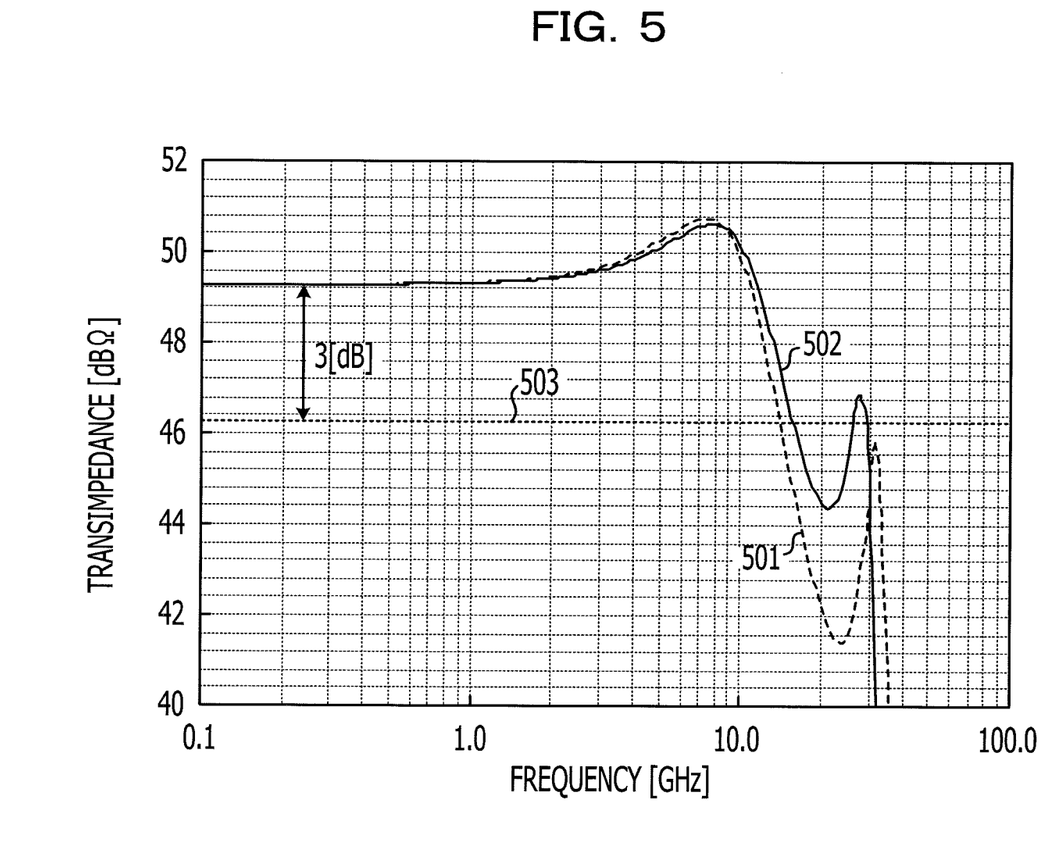
FIG. 5 illustrates an exemplary band expansion by an amplifier circuit.

FIG. 5 illustrates an exemplary band expansion by an amplifier circuit. The horizontal axis indicates the frequency [GHz] of a signal, and the vertical axis indicates the transimpedance [dBΩ] of the signal. A characteristic 501 indicates a characteristic of the transimpedance with respect to the frequency of the signal in a configuration in which an ESD element is coupled proximate to an input pad. A characteristic 502 indicates a characteristic of the transimpedance with respect to the frequency of the signal in a configuration in which the ESD element 120 illustrated in FIG. 4 is coupled between the on-chip inductor 130 and the TIA 150.

A reference value 503 may be a transimpedance lower than the transimpedance in low frequencies by 3 [dB]. As illustrated in the characteristics 501 and 502, the band in which the transimpedance is equal to or higher than the reference value 503 may be expanded by, for example, about 10 [%], since the ESD element 120 is coupled between the on-chip inductor 130 and the TIA 150.

Figure 6:
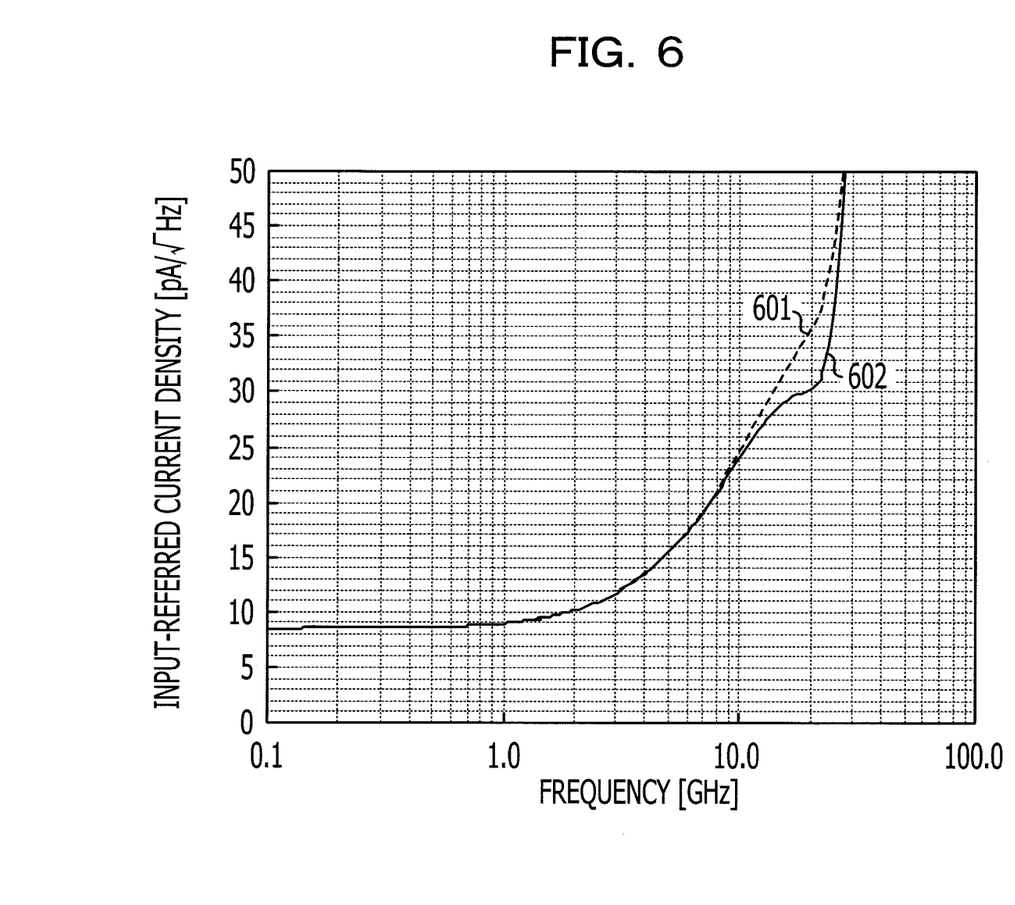
FIG. 6 illustrates an exemplary noise reduction by an amplifier circuit.

FIG. 6 illustrates an exemplary noise reduction by an amplifier circuit. The horizontal axis indicates the frequency [GHz] of a signal, and the vertical axis indicates the input-referred current density [pA/√Hz] of the signal. A characteristic 601 indicates a characteristic of the input-referred current density with respect to the frequency of the signal in a configuration in which an ESD element is coupled proximate to an input pad.

A characteristic 602 indicates a characteristic of the input-referred current density with respect to the frequency of the signal in a configuration in which the ESD element 120 illustrated in FIG. 4 is coupled between the on-chip inductor 130 and the TIA 150. As illustrated in the characteristics 601 and 602, the input-referred current density (noise) may be reduced, since the ESD element 120 is coupled between the on-chip inductor 130 and the TIA 150.

Figure 7:
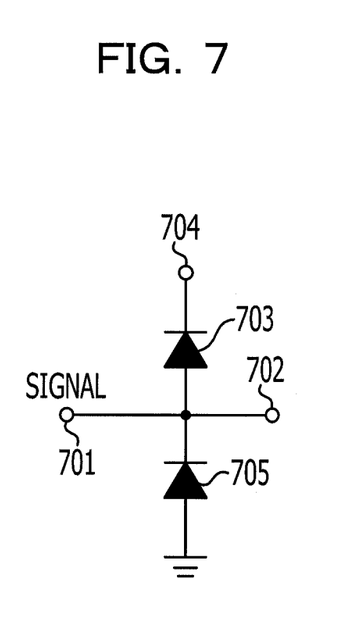
FIG. 7 illustrates an exemplary ESD element.

FIG. 7 illustrates an exemplary ESD element. In a portion of the ESD element 120 illustrated in FIG. 4, the configuration illustrated in FIG. 7 may be used, for example. An input portion 701 may be a portion that is electrically coupled to the on-chip inductor 130. An output portion 702 may be a portion that is electrically coupled to the TIA 150. Diodes 703 and 705 may be provided as the ESD element 120.

The diode 703 may correspond to a first diode of which an anode is electrically coupled between the input portion 701 and the output portion 702 and of which a cathode is electrically coupled to a power source 704. The diode 705 may correspond to a second diode of which an anode is electrically coupled to the ground and of which a cathode is electrically coupled between the input portion 701 and the output portion 702. The diodes 703 and 705 may be, for example, field effect transistors (EFT).

When static electricity is applied to the input portion 701, the diodes 703 and 705 are turned on and the static electricity flows to the ground. Thus, flow of the static electricity into the TIA 150 may be reduced. Thus, the TIA 150 and the circuit subsequent to the TIA 150 may be protected from static electricity. The diodes 703 and 705 serve as capacitances, and thus a resonant circuit is formed by the capacitance of the pad 111, the on-chip inductor 130, and the diodes 703 and 705. Therefore, the band and the signal characteristic such as noise characteristic may improve.

Figure 8:
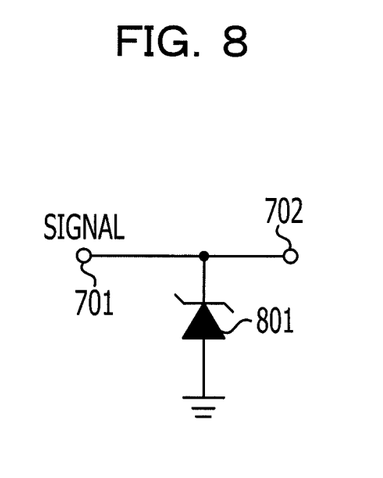
FIG. 8 illustrates an exemplary ESD element.

FIG. 8 illustrates an exemplary ESD element. In FIG. 8, elements that are substantially the same as or similar to the elements illustrated in FIG. 7 are designated by the same reference signs, and the description thereof may be omitted or reduced. A Zener diode 801 (voltage regulator diode) may be an element provided as the ESD element 120. The anode of the Zener diode 801 is electrically coupled between the input portion 701 and the output portion 702, and the cathode of the Zener diode 801 is electrically coupled to the ground.

When static electricity is applied to the input portion 701, the Zener diode 801 is turned on and the static electricity flows to the ground. Thus, flow of the static electricity into the TIA 150 may be reduced. Therefore, the TIA 150 and the circuit subsequent to the TIA 150 may be protected from static electricity. The Zener diode 801 serves as a capacitance, and thus a resonant circuit is formed by the capacitance of the pad 111, the on-chip inductor 130, and the Zener diode 801. Therefore, the band and the signal characteristic such as noise characteristic may improve.

Figure 9:
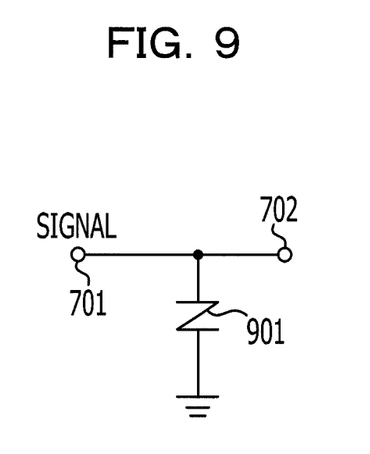
FIG. 9 illustrates an exemplary ESD element.

FIG. 9 illustrates an exemplary ESD element. In FIG. 9, elements that are substantially the same as or similar to the elements illustrated in FIG. 7 are designated by the same reference signs, and the description thereof may be omitted or reduced. A varistor 901 may be an element provided as the ESD element 120. An end of the varistor 901 is electrically coupled between the input portion 701 and the output portion 702, and another end of the varistor 901 is electrically coupled to the ground.

The varistor 901 has a high resistance when the potential difference between both ends of the varistor 901 is small, and has a low resistance when the potential difference between both ends of the varistor 901 is great. Thus, when static electricity is applied to the input portion 701, the varistor 901 has a low resistance and flow of the static electricity into the TIA 150 may be reduced. Therefore, the TIA 150 and the circuit subsequent to the TIA 150 may be protected from static electricity.

The varistor 901 serves as a capacitance, and thus a resonant circuit is formed by the capacitance of the pad 111, the on-chip inductor 130, and the varistor 901. The band and the signal characteristic such as noise characteristic may improve.

In the amplifier circuit 100, since the ESD element 120 is provided subsequent to the on-chip inductor 130, the ESD element 120 may be used as a shunt capacitance forming a resonant circuit. For example, since the shunt capacitance 140 illustrated in FIG. 1 is omitted, the size of the circuit may be reduced.

The size of the circuit may be reduced due to the above-described amplifier circuit and light receiving circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifier circuit comprising:
   an input pad to receive a current signal;
   a conversion section to convert the current signal into a voltage signal;
   an inductor electrically connected in series between the input pad and the conversion section; and
   a storage element, one end of the storage element electrically coupled between the inductor and the conversion section, the other end of the storage element electrically coupled to a ground, the storage element including a first diode of which a cathode is coupled to a power source and of which an anode is coupled between the inductor and the conversion section and a second diode of which a cathode is coupled between the inductor and the conversion section and of which an anode is coupled to the ground.

2. The amplifier circuit according to claim 1, wherein the input pad, the conversion section, the inductor, and the storage element are provided on a chip.

3. The amplifier circuit according to claim 1, wherein the storage element flows, to the ground, static electricity applied to the input pad.

4. The amplifier circuit according to claim 3, wherein no additional element is provided between the input pad and the inductor.

5. An amplifier circuit comprising:
   an input pad to receive a current signal;
   a conversion section to convert the current signal into a voltage signal;
   an inductor electrically connected in series between the input pad and the conversion section; and
   a storage element, one end of the storage element electrically coupled between the inductor and the conversion section, the other end of the storage element electrically coupled to a ground, the storage element including a Zener diode of which a cathode is coupled between the inductor and the conversion section and of which an anode is coupled to the ground.

6. The amplifier circuit according to claim 5, wherein the input pad, the conversion section, the inductor, and the storage element are provided on a chip.

7. The amplifier circuit according to claim 5, wherein the storage element flows, to the ground, static electricity applied to the input pad.

8. The amplifier circuit according to claim 7, wherein no additional element is provided between the input pad and the inductor.

9. An amplifier circuit comprising:
   an input pad to receive a current signal;
   a conversion section to convert the current signal into a voltage signal;
   an inductor electrically connected in series between the input pad and the conversion section; and
   a storage element, one end of the storage element electrically coupled between the inductor and the conversion section, the other end of the storage element electrically coupled to a ground, the storage element including a varistor of which one end is coupled between the inductor and the conversion section and of which the other end is coupled to the ground.

10. The amplifier circuit according to claim 9, wherein the input pad, the conversion section, the inductor, and the storage element are provided on a chip.

11. The amplifier circuit according to claim 9, wherein the storage element flows, to the ground, static electricity applied to the input pad.

12. The amplifier circuit according to claim 11, wherein no additional element is provided between the input pad and the inductor.

13. A light receiving circuit comprising:
- a photodiode to output a current signal corresponding to received light;
- an input pad to receive the current signal from the photodiode;
- a conversion section to convert the current signal into a voltage signal;
- an inductor coupled in series between the photodiode and the conversion section; and
- a storage element provided on a chip, an end of the storage element coupled between the on-chip inductor and the conversion section, the other end of the storage element coupled to a ground, the storage element including a first diode of which a cathode is coupled to a power source and of which an anode is coupled between the inductor and the conversion section and a second diode of which a cathode is coupled between the inductor and the conversion section and of which an anode is coupled to the ground.

14. The light receiving circuit according to claim 13, wherein the input pad, the conversion section, and the storage element are provided on the same chip.

15. The light receiving circuit according to claim 13, wherein the storage element flows, to the ground, static electricity applied to the input pad.

* * * * *